(12) United States Patent
Buck et al.

(10) Patent No.: US 7,555,740 B2
(45) Date of Patent: Jun. 30, 2009

(54) METHOD AND SYSTEM FOR EVALUATING STATISTICAL SENSITIVITY CREDIT IN PATH-BASED HYBRID MULTI-CORNER STATIC TIMING ANALYSIS

(75) Inventors: Nathan C. Buck, Underhill, VT (US); John P. Dubuque, Jericho, VT (US); Eric A. Foreman, Fairfax, VT (US); Peter A. Habitz, Hinesburg, VT (US); Kerim Kalafala, Rhinebeck, NY (US); Peihua Qi, Wappingers Falls, NY (US); Chandramouli Visweswariah, Croton-on-Hudson, NY (US); Xiaoyue Wang, Kanata (CA)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 11/679,251

(22) Filed: Feb. 27, 2007

(65) Prior Publication Data
US 2008/0209373 A1  Aug. 28, 2008

(51) Int. Cl.
*G06F 17/50* (2006.01)
(52) U.S. Cl. .................. 716/12; 716/4; 716/6; 716/18
(58) Field of Classification Search .................. 716/4, 716/6, 12, 18
See application file for complete search history.

(56) References Cited

U.S. PATENT DOCUMENTS

| | | | |
|---|---|---|---|
| 6,046,984 A | 4/2000 | Grodstein et al. | |
| 6,080,201 A * | 6/2000 | Hojat et al. | ............ 703/14 |
| 6,604,227 B1 | 8/2003 | Foltin et al. | |
| 6,851,098 B2 | 2/2005 | Schultz | |
| 7,092,838 B1 | 8/2006 | Srinivas et al. | |
| 7,111,260 B2 | 9/2006 | Visweswariah | |
| 7,117,466 B2 | 10/2006 | Kalafala et al. | |
| 2004/0002844 A1 | 1/2004 | Jess et al. | |
| 2004/0044976 A1 | 3/2004 | Schultz | |
| 2005/0065765 A1 | 3/2005 | Visweswariah | |
| 2005/0066297 A1 | 3/2005 | Kalafala et al. | |

(Continued)

FOREIGN PATENT DOCUMENTS

JP   2005141434 A   6/2005

OTHER PUBLICATIONS

Lee W. Young, "PCT International Search Report," International Business Machines Corporation, Jul. 31, 2008, 3 pages.

*Primary Examiner*—Thuan Do
(74) *Attorney, Agent, or Firm*—Ryan K. Simmons; Hoffman Warnick LLC (57) ABSTRACT

Methods, systems and computer program products for analyzing a timing design of an integrated circuit are disclosed. According to an embodiment, a method for analyzing a timing design of an integrated circuit comprises: providing an initial static timing analysis of the integrated circuit; selecting a static timing test with respect to a static timing test point based on the initial static timing analysis; selecting a timing path leading to the static timing test point for the static timing test; determining an integrated slack path variability for the timing path based on a joint probability distribution of at least one statistically independent parameter; and analyzing the timing design based on the integrated slack path variability.

22 Claims, 3 Drawing Sheets

U.S. PATENT DOCUMENTS

| | | |
|---|---|---|
| 2005/0114811 A1 | 5/2005 | Schultz |
| 2005/0172250 A1 | 8/2005 | Kucukcakar et al. |
| 2005/0246116 A1 | 11/2005 | Foreman et al. |
| 2008/0072198 A1* | 3/2008 | Celik et al. .................... 716/6 |

* cited by examiner

METHOD AND SYSTEM FOR EVALUATING STATISTICAL SENSITIVITY CREDIT IN PATH-BASED HYBRID MULTI-CORNER STATIC TIMING ANALYSIS

BACKGROUND

1. Technical Field

The present disclosure relates in general to integrated circuit processing, and more particularly to static timing analysis of an integrated circuit with respect to processing parameters.

2. Background Art

Corner-based static timing has long been the bedrock technology for timing verification of integrated circuits. Timing of integrated circuits with the same timing design may vary due to processing variations. A corner refers to a set of parameters/conditions (hereinafter "parameter") that cause variations in the static timing. Processing variations can be classified into two groups: global variations and local variations. Conventionally, global variations, also referred to as chip-to-chip variations, are accommodated by a multi-corner timing. Specifically, every global variation is set to its three-standard deviation (3 sigma) extreme corners, one corner providing the fastest signal propagating checked in the fast chip timing analysis and another corner providing the slowest signal propagation checked in the slow chip timing analysis. Local variations, also referred to as on-chip variations, are modeled by means of creating timing skew by making early path latency smaller and late path latency larger. This is referred to as an early/late split. The early/late split is often introduced by "derating coefficients".

SUMMARY

A first aspect of the invention provides a method for analyzing a timing design of an integrated circuit, the method comprising: providing an initial static timing analysis of the integrated circuit; selecting a static timing test with respect to a static timing test point based on the initial static timing analysis; selecting a timing path leading to the static timing test point for the static timing test; determining an integrated slack path variability for the timing path based on a joint probability distribution of at least one statistically independent parameter; and analyzing the timing design based on the integrated slack path variability.

A second aspect of the invention provides a system for analyzing a timing design of an integrated circuit, the system comprising: means for receiving an initial static timing analysis of the integrated circuit; means for selecting a static timing test with respect to a static timing test point based on the initial static timing analysis; means for selecting a timing path leading to the static timing test point for the static timing test; means for determining an integrated slack path variability for the timing path based on a joint probability distribution of at least one statistically independent parameter; and means for analyzing the timing design based on the integrated slack path variability.

A third aspect of the invention provides a computer program product for analyzing a timing design of an integrated circuit, comprising: computer usable program code which, when executed by a computer system, enable the computer system to: receive an initial static timing analysis of the integrated circuit; select a static timing test with respect to a static timing test point based on the initial static timing analysis; select a timing path leading to the static timing test point for the static timing test; determine an integrated slack path variability for the timing path based on a joint probability distribution of at least one statistically independent parameter; and analyze the timing design based on the integrated slack path variability.

A fourth aspect of the invention provides a method of generating a system for analyzing a timing design of an integrated circuit, the method comprising: providing a computer infrastructure operable to: receive an initial static timing analysis of the integrated circuit; select a static timing test with respect to a static timing test point based on the initial static timing analysis; select a timing path leading to the static timing test point for the static timing test; determine an integrated slack path variability for the timing path based on a joint probability distribution of at least one statistically independent parameter; and analyze the timing design based on the integrated slack path variability.

Other aspects and features of the present invention, as defined solely by the claims, will become apparent to those ordinarily skilled in the art upon review of the following non-limited detailed description of the disclosure in conjunction with the accompanying figures.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the invention. In the drawings, like numbering represents like elements among the drawings.

DETAILED DESCRIPTION OF THE DISCLOSURE

The following detailed description of embodiments refers to the accompanying drawings, which illustrate specific embodiments of the disclosure. Other embodiments having different structures and operations do not depart from the scope of the present invention.

1. Computer System

Figure 1:
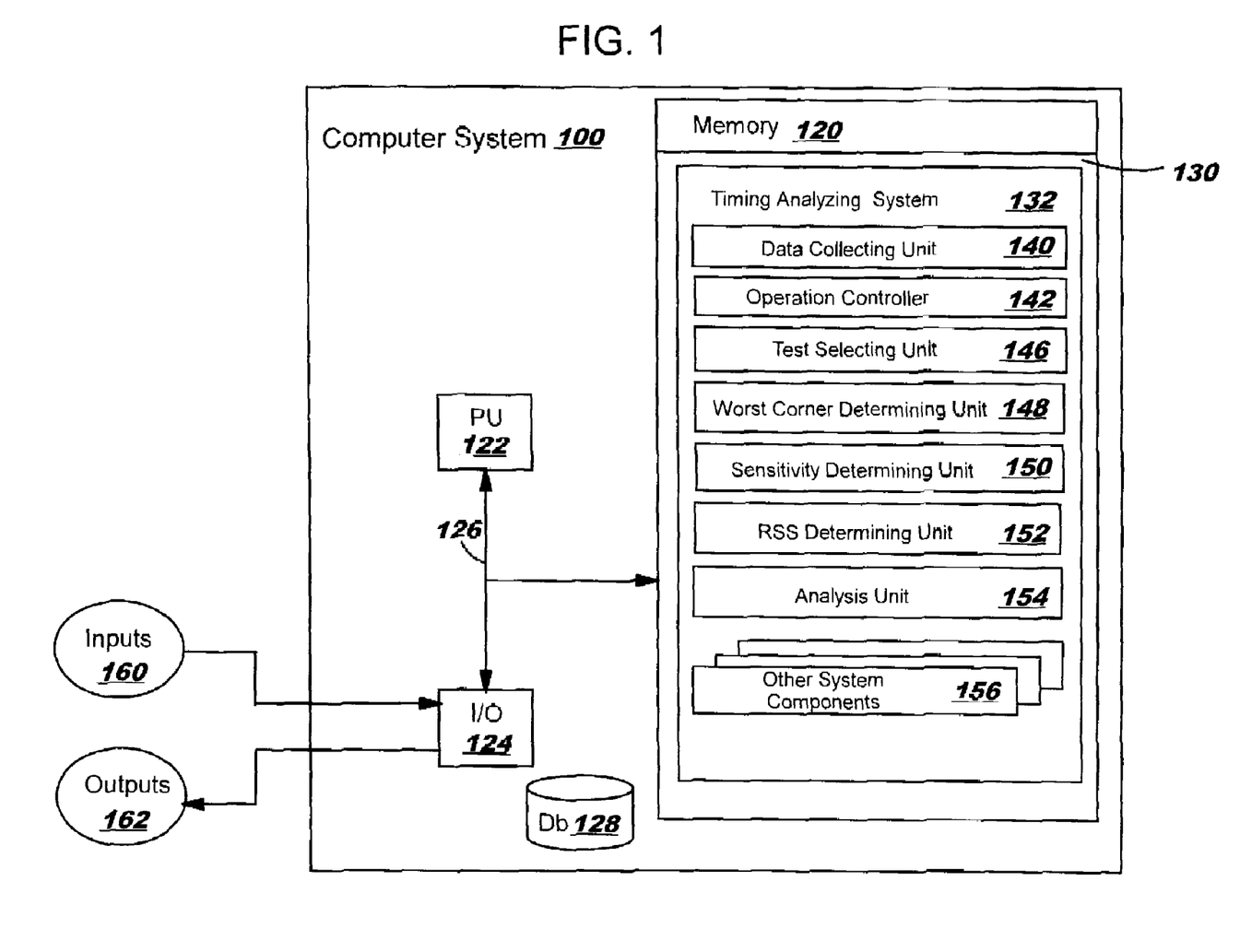
FIG. 1 shows a block diagram of an illustrative computer system according to an embodiment.

Referring to FIG. 1, a block diagram of an illustrative computer system 100 according to an embodiment of the disclosure is shown. In an embodiment, computer system 100 includes a memory 120, a processing unit (PU) 122, input/output devices (I/O) 124 and a bus 126. A database (Db) 128 may also be provided for storage of data relative to processing tasks. Memory 120 includes a program product 130 which, when executed by PU 122, comprises various functional capabilities described in further detail below. Memory 120 (and database 128) may comprise any known type of data storage system and/or transmission media, including magnetic media, optical media, random access memory (RAM), read only memory (ROM), a data object, etc. Moreover, memory 120 (and database 128) may reside at a single physical location comprising one or more types of data storage, or be distributed across a plurality of physical systems. PU 122 may likewise comprise a single processing unit, or a plurality of processing units distributed across one or more locations.

I/O 124 may comprise any known type of input/output device including a network system, modem, keyboard, mouse, scanner, voice recognition system, CRT, printer, disc drives, etc. Additional components, such as cache memory, communication systems, system software, etc., may also be incorporated into computer system 100.

As shown in FIG. 1, program product 130 may include a timing analysis system 132. Timing analysis system 132 may include a data collecting unit 140; an operation controller 142; a test selecting unit 146; a worst corner determining unit 148; a sensitivity determining unit 150; an integrated slack path variability (RSS) determining unit 152; an analysis unit 154; and other system components 156. Other system components 156 may include any now known or later developed parts of a computer system 100 not individually delineated herein, but understood by those skilled in the art.

Inputs 160 to computer system 100 include, for example, data regarding an integrated circuit under design including, e.g., parameters of various components of the integrated circuit. A parameter may be any parameter of a component. A processing parameter and/or an operation parameter are included as a parameter of a component. Those inputs may be communicated to computer system 100 through I/O 124 and may be stored in database 128. In the operation of timing analysis system 132, the input data may be collected by data collecting unit 140. Outputs 162 of computer system 100 include, for example, results of the timing analysis operation that is communicated to, inter alia, a user or a customer who pays for the service to act accordingly. For example, after timing analysis operation, timing analysis system 132 may suggest a user to apply credits to remove unnecessary pessimism in an initial timing design. The operation of timing analysis system 132 will be described in detail below.

2. Operation Methodology

Figure 2:
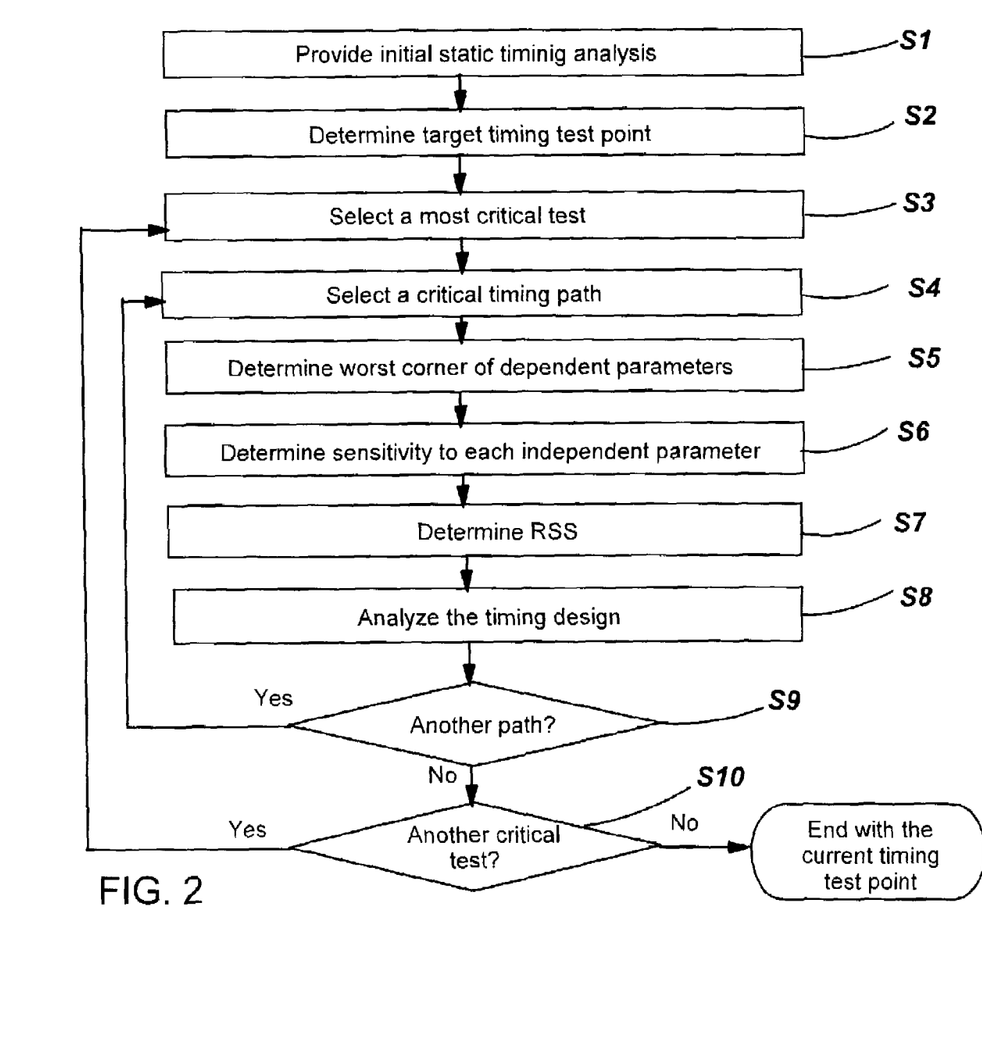
FIG. 2 shows an embodiment of the operation of a timing analysis system.

FIG. 2 shows embodiments of the operation of timing analysis system 132. Referring now to FIGS. 1-2, in process S1, data collecting unit 140 provides a target integrated circuit (IC) of an initial static timing analysis. Specifically, data collecting unit 140 receives/collects data for the target integrated circuit including, e.g., the initial static timing analysis and parameters of various components of the integrated circuit.

The initial static timing analysis (STA) may include determining the latest and earliest possible switching times of various signals within the integrated circuit. STA may be performed at the transistor level, at the gate level using pre-characterized library elements, or at higher levels of abstraction, for complex hierarchical chips. For example, STA algorithms may operate by first levelizing the logic structure, and breaking any loops in order to create a directed acyclic graph (timing graph). Modern designs can often contain millions of placeable objects, with corresponding timing graphs having millions, if not tens of millions of nodes. For each node, a corresponding arrival time, transition rate (slew), and required arrival time are computed for both rising and falling transitions for early and late mode analysis. An arrival time (AT) represents the latest or earliest time at which a signal can transit due to the entire upstream fan-in cone. The slew value is the transition rate associated with a corresponding AT. A required arrival time (RAT) represents the latest or earliest time at which a signal must transit due to timing constraints in the entire downstream fan-out cone.

For example, ATs are propagated forward in a levelized manner, starting from the chip primary input asserted (i.e., user-specified) arrival times, and ending at either primary output ports or intermediate storage elements. For single fan-in cases, AT sink node=AT source node+delay from source to sink. Whenever multiple signals merge, each fan-in contributes a potential arrival time computed as AT sink (potential) =AT source+delay, and then the maximum (late mode) or minimum (early mode) of all potential arrival times is retained. RATs are computed in a backward levelized manner starting from either asserted required arrival times at chip primary output pins, or from tests (e.g., setup or hold constraints) at internal storage devices. For single fan-out cases, RAT source node=RAT sink node−delay. When multiple fan-outs merge (or a test is present), each fan-out (or test) contributes a prospective RAT, and then minimum (late mode) or maximum (early mode) required arrival time is retained. The difference between the arrival time and required arrival time (RAT−AT in late mode, and AT−RAT in early mode) is referred to as a slack. A positive slack implies that the current arrival time at a given node meets all downstream timing constraints, and a negative slack implies that the arrival time fails at least one such downstream timing constraint.

The initial design timing may include a slack under a worst corner of all parameters, i.e., a worst slack. The initial timing is "initial" only to the extent that the initial timing will be analyzed and adjusted by the operation of timing analysis system 132. It should be appreciated that any initial design timing is possible and all are included. According to an embodiment, the initial timing is designed to accommodate the worst processing corners. That is, the initial timing is designed such that the target IC functions properly with the worst slack. As such, it is appreciated that the initial timing is overly pessimistic as it is very unlikely that the worst corner happens. According to another embodiment, the initial timing is designed normally, i.e., without using the worst processing corners, and the worst slack is considered in the timing analysis operation.

In the current description, timing slack may be defined by various types of static timing tests including but not limited to: setup test, hold test, clock gating test, pulse width test, and pulse separation test. For example, a setup test slack of a timing path leading to a storage element may be determined using the following equation:

$$\text{setup test slack} = \text{early mode clock arrival time} + \text{clock cycle adjust} - \text{late mode data arrival time} - \text{guard time} \quad (1),$$

where the clock cycle adjust indicates a time adjustment based on a clock cycle difference between the clock signal of said storage element and a clock signal of a data sending element in the timing path that sends data to said storage element; and guard time is a separation between the clock and data arrival times at said storage element that is required for said storage element to function correctly. Similarly, a hold test slack may be may be determined using the following equation:

$$\text{hold test slack} = \text{early mode data arrival time} - \text{late mode clock arrival time} - \text{clock cycle adjust} - \text{guard time} \quad (2),$$

As is appreciated, clock and data arrival times of a timing path on a produced integrated circuit may be affected by variations in the parameters. For example, a worst corner of parameters regarding a setup slack is the set of parameters that produce the earliest clock arrival and the latest data arrival at a target timing point.

In process S2, test selecting unit 146 selects a target static timing test point is under the initial design timing for further analysis. A timing test point may include any point in a circuit to be analyzed in a static timing test. Any now known or later developed standards/tests may be used in the determination of a target timing test point, and all are included. In the following description, a target timing test point will be referred to as an "endpoint" for simplification purposes. For example, the endpoints that have timing slacks failing to meet a specified threshold will be selected as target endpoints. Specifically, for example, if a clocked element includes a setup slack below a lower threshold under a particular set of processing parameters/conditions, this clocked element will be selected as an endpoint because it is more likely to be affected by processing variations.

Figure 3:
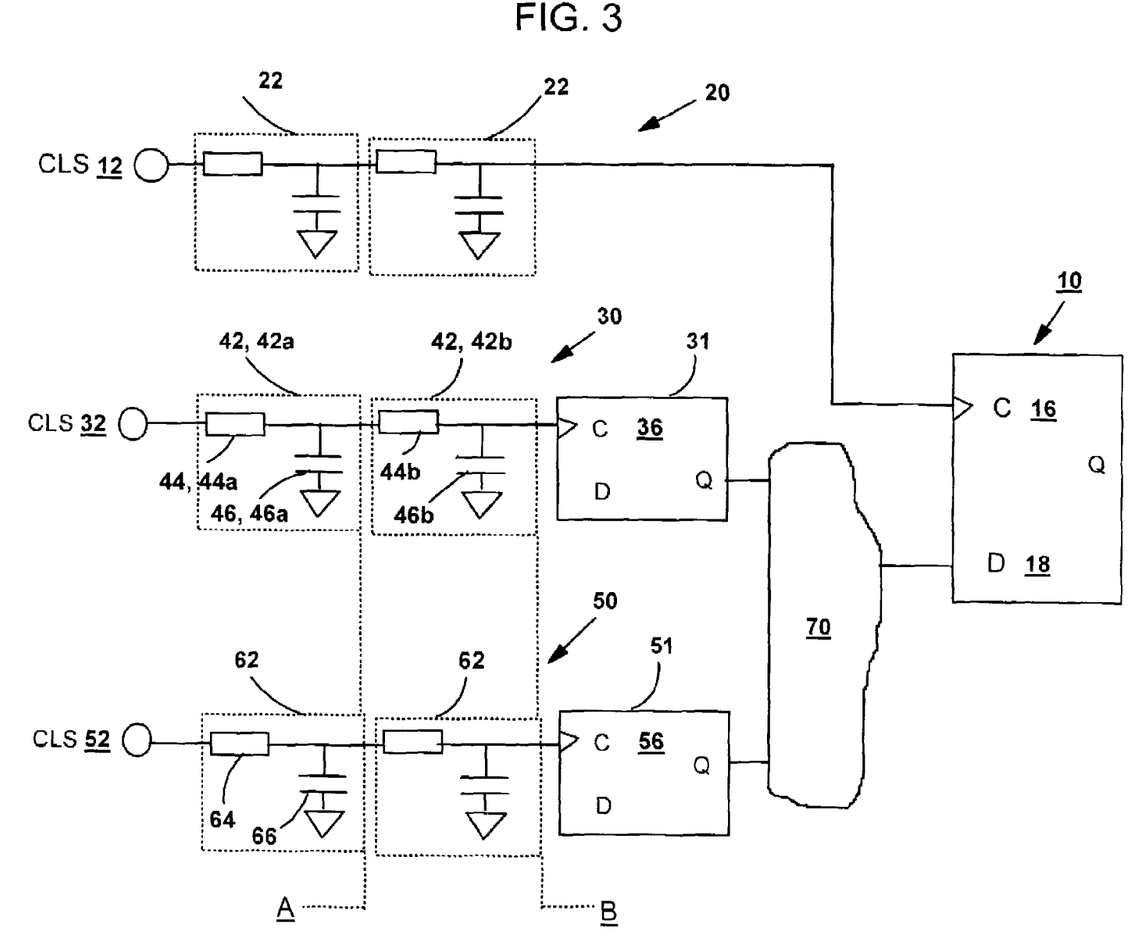
FIG. 3 shows an illustrative example of an endpoint with timing paths leading thereto.

FIG. 3 shows an illustrative example of a clocked element 10, e.g., a latch, with three timing paths 20, 30 and 50 leading to it. In timing path 20, a clock signal is propagated from clock source (CLS) 12 through chip wirings 22 to a clock pin (C) 16 of latch 10. Timing path 30 includes a latch 31 that sends data through logic 70 to a data pin (D) 18 of latch 10. In timing path 30, a clock signal is propagated from clock source (CLS) 32 through chip wirings 42 to a clock pin (C) 36 of latch 31 to propagate a data output of latch 31. Timing path 50 includes a latch 51 that sends data through logic 70 to data pin (D) 18 of latch 10. In timing path 50, a clock signal is propagated from clock source (CLS) 52 through chip wirings 62 to a clock pin (C) 56 of latch 51 to propagate a data output of latch 51. Other components in a path, e.g., buffers, are eliminated for simplification purposes. In the following description, data pin 18 will be used as an illustrative example of a selected endpoint. It should be appreciated that timing paths 20, 30, 50 in FIG. 3 are used for illustrative purpose only and do not limit the scope of the present invention. An endpoint with any kinds of timing paths leading thereto is included in the current disclosure.

As shown in FIG. 3, each chip wiring 22, 42, 62 includes a resistance unit 22, 44, 64, respectively, and a capacitance unit, 26, 46, 66, respectively. The combination of a resistance unit, e.g., 44, and a capacitance unit, e.g., 46, affects, inter alia, the delay of a chip wiring, e.g., 42. Chip wirings, e.g., 42a and 42b, of a path, e.g., path 30, may not be in the same metal layer. As such, capacitance values of capacitance units 46a, 46b are affected by variations of, e.g., the respective metal layers thereon. As a consequence, the slack of a timing path, e.g., path 30, is affected by variations in a metal layer, e.g., the metal layer thickness. As shown in FIG. 3, capacitance unit 46a and 66a are in the same metal layer A, and capacitance unit 46b and 66b are in the same metal layer B, for illustrative purposes.

The following processes will be performed with respect to each selected endpoint.

Referring to FIGS. 1-3, in process S3, test selecting unit 146 selects a static timing test with respect to the selected static timing test point for further analysis. The static timing tests may include but not limited to: setup test, hold test, clock gating test, pulse width test, and pulse separation test. According to an embodiment, test selecting unit 146 selects a test under which a slack of the selected endpoint, e.g., endpoint 18, is below a preset threshold. Such a static timing test will be referred to as a critical test as the slack under this test is more likely to be affected by parameter variations to cause a timing failure. According to an embodiment, test selecting unit 146, in coordination with operation controller 142, selects a more critical test, i.e., test under which endpoint 18 has a worse slack, to analyze before a less critical test.

In process S4, operation controller 142 selects a timing path leading to the selected static timing test point for the selected static timing test. According to an embodiment, in the situation of multiple timing paths leading the selected endpoint, operation controller 142 ranks all the timing paths, e.g., paths 30, 50, based on their slacks, and selects a timing path that has the worst slack among all the timing paths for analysis first. Such a path will be referred to as a 'critical path'. It should be appreciated that a 'critical path' is defined relevant to the specific time of determination. For example, a critical path under the initial timing may be adjusted to be less critical than other paths after further analysis processes described below. For illustrative purposes, it is assumed that path 30 of FIG. 3 is selected as a critical path under the initial timing and is operated upon.

In process S5, worst corner determining unit 148 determines a worst corner of statistically dependent parameters for the selected timing path, e.g., path 30. In the current description, a statistically dependent parameter refers to a parameter whose contribution to the timing of a timing path is related to other parameter(s). A statistically independent parameter refers to a parameter whose contribution to the timing of a timing path is not related to other parameter(s). For example, statistically independent parameters may include: metal layer thickness for each wiring plane of the integrated circuit, a temperature of the integrated circuit, a power supply voltage, device family mistracking, and transistor degradation over time. A worst corner refers to the combination of relevant processing parameters that produces the worst slack for the timing path for the selected timing test. All possibly allowed combinations of statistically dependent parameters may be tested to find the worst corner. In addition, any now known or later developed method may be used in determining the worst corner and all are included. For example, a path tracing tool, e.g., Variation Aware Timing of IBM, may be used to determine the worst corner of statistically dependent parameters.

By definition, statistically independent parameters do not affect the contribution of statistically dependent parameters to the timing of the timing path. As such, in the determination of the worst corner of the statistically dependent parameters, the statistically independent parameters may be assumed to have any desired preset values.

In process S6, sensitivity determining unit 150 determines a sensitivity of the timing path to each statistically independent parameter under the worst corner of the statistically dependent parameters, the sensitivity being determined based on a probability distribution of the statistically independent variable. The sensitivity indicates a variation in the slack of the timing path caused by a unit variation in the statistically independent parameter. According to an embodiment, the sensitivity is determined approximately using formula:

$$S=(P_b-P_w)/(\sigma_b-\sigma_w) \quad (3),$$

where S indicates the sensitivity, $P_b$ indicates a slack under a best corner of the statistically independent parameter, and $P_w$ indicates a slack under the worst corner of the statistically independent parameter, and $\sigma_b$, $\sigma_w$ indicates the number of sigma points of the distribution limits at the best and the worst corners of the statistically independent parameter. According to an embodiment, the best corner and the worst corner of the statistically independent parameter are both within the 6 sigma ($\sigma$) range of the distribution of the statistically independent parameter.

It is to be understood that any method of calculating the sensitivity may be employed including adjoint sensitivity calculation, direct method sensitivity calculation, calculation of sensitivity stage-by-stage, or calculation of sensitivity for the entire timing path. Thus one of ordinary skill in the art will be able to apply various sensitivity computation methods within the scope of the present invention.

In addition, sensitivity determining unit 150 optionally determines a slack path variability ($V_\sigma$) of the timing path with respect to the statistically independent parameter. According to an embodiment, the slack path variability is determined as approximately the square of the product of the sensitivity (S) and the standard deviation (σ) of the statistically independent parameter. That is:

$$V_\sigma = s^2 \sigma^2 \quad (4),$$

For an illustrative example, a thickness of a metal layer, e.g., metal layers A, may be a statistically independent parameter. The contribution of metal layers A and B are independent as is appreciated. Thickness of metal layer A affects the capacitance of capacitance units 46a. As such, the delay of wiring 42a and the slack of timing path 30 are affected by the thickness of metal layer A. Similarly, thickness of metal layer B affects the delay of wiring 42b, and the slack of timing path 30. However, sensitivity of timing path 30 to the thickness of metal layers A and B, respectively, may be different. In process S6, sensitivity determining unit 150 determines a sensitivity of timing paths 30 to the thickness of each of metal layers A and B. It should be appreciated that metal thickness of metal layers A and B are used only as illustrative examples of statistically independent parameters, but do not limit the scope of the disclosure. As will be described later, analysis unit 154 analyzes the initial timing design of the target IC, specifically, the selected path, based on, inter alia, the calculated sensitivity.

In process S7, RSS determining unit 152 determines an integrated slack path variability of the selected path based on a joint probability distribution of all the statistically independent parameters. The integrated slack path variability will be referred to as an "RSS" for purposes of simplification. According to an embodiment, the RSS determination is also based on the sensitivities of each statistically independent parameter. According to an embodiment, RSS is determined approximately as n times the Root Sum Square of the slack path variability of all statistically independent parameters. That is:

$$RSS = n\sqrt{\sum_{x=1}^{m}(S_x \sigma_x)^2}, \quad (5)$$

where $S_x$ indicates sensitivity of the timing path to a statistically independent parameter x, $\sigma_x$ indicates a standard deviation (sigma) of statistically independent parameter x, n is a positive value less than approximately 6, preferably approximately 3, and m indicates a total number of statistically independent parameters. As described above, $S_x^2 \sigma_x^2 = V_\sigma$ of statistically independent parameter x. It should be appreciated that equation (5) does not limit the scope of the invention and other ways of determining RSS based on the joint probability distribution and the sensitivities are also possible and included.

In process S8, analysis unit 154 analyzes the initial timing design based on the integrated slack path variability. According to an embodiment, the analysis is also based on a slack of path 30 under the worst corner of the statistically dependent parameters. Any method of applying the integrated slack path variability (RSS) in the timing analysis may be used and all are included in the disclosure. For example, the determined RSS may be used as a credit to adjust the slack of path 30. After the analysis is performed, the slack of the path, e.g., path 30, may be modified to be either better or worse than the slack under the initial timing. While equation (5) indicates that RSS credit is computed preferably to 3 sigmas, any number of sigmas can be used based on the desired timing protection and desired yield.

In process S9, operation controller 142 determines whether there is another timing path leading to the selected endpoint, e.g., endpoint 10, to be operated thereupon. If there is another timing path, e.g., path 40, to be operated upon, operation controller 142 controls the operation of timing analyzing system 132 to go to process S4. If there is no more timing path, operation controller 142 controls the operation of timing analyzing system 132 to go to process S10. The determination may be based on preset exit criteria. For example, operation controller 142 may check whether the modified slack is above a given threshold so that further analysis of other paths is not required. For another example, the total number of paths to be analyzed for each endpoint may be set based on, e.g., a cost to the computation resources. If operation controller 142 determined that the number has been reached, i.e., no other timing path allowed to be analyzed, it will control the operation to process S10.

In process S10, operation controller 142 determines whether there is another critical test to be operated thereupon. If there is another critical test, operation controller 142 controls the operation of timing analyzing system 132 to go to process S3. If there is no more critical test, operation controller 142 controls the operation of timing analyzing system 132 to end with the endpoint.

3. Conclusion

While shown and described herein as a method and system for analyzing a timing design of an integrated circuit, it is understood that the invention further provides various alternative embodiments. For example, in an embodiment, the invention provides a program product stored on a computer-readable medium, which when executed, enables a computer infrastructure to analyze a timing design of an integrated circuit. To this extent, the computer-readable medium includes program code, such as timing analyzing system 132 (FIG. 1), which implements the process described herein. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 120 (FIG. 1) and/or database 128 (FIG. 1), and/or as a data signal traveling over a network (e.g., during a wired/wireless electronic distribution of the program product).

In another embodiment, the invention provides a method of generating a system for analyzing a timing design of an integrated circuit. In this case, a computer infrastructure, such as computer system 100 (FIG. 1), can be obtained (e.g., created, maintained, having been made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing system 100 (FIG. 1), from a computer-readable medium; (2) adding one or more computing devices to the computer infrastructure; and (3) incorporating and/or modifying one or more existing systems of the computer infrastructure to enable the computer infrastructure to perform the process processes of the invention.

While the invention is described by means of a simple illustrative example, it is understood that this specific example does not limit the scope of the invention. For example, it is understood that while the illustrative example shows a small circuit and a small timing graph, the invention may be applied to circuits and graphs of any size. In the illustrative example, for purposes of clarity, rising and falling timing quantities were not differentiated, but the invention may be applied to a situation with different rising and falling delays, slews, ATs and RATs. The invention may also be applied to any type of static timing, including, but not limited to, static timing of gate-level circuits, transistor-level circuits, hierarchical circuits, circuits with combinational logic, circuits with sequential logic, timing in the presence of coupling noise, timing in the presence of multiple-input switching, timing in the presence of arbitrary timing tests such as setup, hold, end-of-cycle, pulse width, clock gating and loop-cut tests, and timing in the presence of multiple clock domains.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like. Further, it is understood that the terms "component" and "system" are synonymous as used herein and represent any combination of hardware and/or software capable of performing some function(s).

The flowcharts and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, processes, operations, elements, and/or components, but do not preclude the presence or addition of one or more other features, integers, processes, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the disclosure has other applications in other environments. This application is intended to cover any adaptations or variations of the present disclosure. The following claims are in no way intended to limit the scope of the invention to the specific embodiments described herein.

What is claimed is:

1. A method for analyzing a timing design of an integrated circuit and operable by a computing processor, the method comprising:

providing an initial static timing analysis of the integrated circuit;

selecting a static timing test with respect to a static timing test point based on the initial static timing analysis;

selecting a timing path leading to the static timing test point for the static timing test;

determining an integrated slack path variability by a computer processor for the timing path based on a joint probability distribution of at least one statistically independent parameter analyzing the timing design based on the integrated slack path variability; and determining a sensitivity of the timing path to each of the at least one statistically independent parameter, the sensitivity being determined based on a probability distribution of the statistically independent parameter wherein the sensitivity to the statistically independent parameter is determined approximately using formula:

$$S=(P_b-P_w)/(\sigma_b-\sigma_w),$$

where S indicates the sensitivity, $P_b$ indicates a slack under a best corner of the statistically independent parameter, and $P_w$ indicates a slack under a worst corner of the statistically independent parameter, and $\sigma_b$ and $\sigma_w$ indicate numbers of sigma points of distribution limits at the best and worst corners of the statistically independent parameter, respectively.

2. The method of claim 1, wherein the integrated slack path variability of the timing path is determined approximately using formula:

$$RSS = n\sqrt{\sum_{x=1}^{m}(S_x\sigma_x)^2},$$

where RSS denotes the integrated slack path variability, $S_x$ denotes sensitivity of the timing path to a statistically independent parameter x, $\sigma_x$ denotes a standard deviation of the statistically independent parameter x, n is a positive value less than approximately 6, and m denotes a total number of the at least one statistically independent parameter with respect to the timing path.

3. The method of claim 1, wherein the static timing test selecting includes selecting a static timing test under which a slack of the static timing test point is below a threshold.

4. The method of claim 1, in response to multiple timing paths leading to the timing test point, further comprising ranking the multiple timing paths based on slacks thereof and selecting a timing path that has the worst slack among the multiple timing paths to analyze first.

5. The method of claim 1, further comprising determining a worst corner of at least one statistically dependent parameter for the timing path.

6. The method of claim 5, wherein the timing design analysis is based on a slack under the worst corner of the at least one statistically dependent parameter.

7. A system for analyzing a timing design of an integrated circuit, the system comprising:
means for receiving an initial static timing analysis of the integrated circuit;
means for selecting a static timing test with respect to a static timing test point based on the initial static timing analysis;
means for selecting a timing path leading to the static timing test point for the static timing test;
means for determining an integrated slack path variability for the timing path based on a joint probability distribution of at least one statistically independent parameter
means for analyzing the timing design based on the integrated slack path variability; and
means for determining a sensitivity of the timing path to each of the at least one statistically independent parameter, the sensitivity being determined based on a probability distribution of the statistically independent parameter wherein the sensitivity determining means determines the sensitivity to the statistically independent parameter approximately using formula:

$$S=(P_b-P_w)/(\sigma_b-\sigma_w),$$

where S indicates the sensitivity, $P_b$ indicates a slack under a best corner of the statistically independent parameter, and $P_w$ indicates a slack under a worst corner of the statistically independent parameter, and $\sigma_b$ and $\sigma_w$ indicate numbers of sigma points of distribution limits at the best and worst corners of the statistically independent parameter, respectively.

8. The system of claim 7, wherein the integrated slack path variability determining means determines the integrated slack path variability of the timing path approximately using formula:

$$RSS = n\sqrt{\sum_{x=1}^{m} (S_x\sigma_x)^2},$$

where RSS denotes the integrated slack path variability, $S_x$ denotes sensitivity of the timing path to a statistically independent parameter x, $\sigma_x$ denotes a standard deviation of the statistically independent parameter x, n is a positive value less than approximately 6, and m denotes a total number of the at least one statistically independent parameter with respect to the timing path.

9. The system of claim 7, wherein the static timing test selecting means selects a static timing test under which a slack of the static timing test point is below a threshold.

10. The system of claim 7, in response to multiple timing paths leading to the timing test point, the timing path selecting means ranks the multiple timing paths based on slacks thereof and selects a timing path that has the worst slack among the multiple timing paths to analyze first.

11. The system of claim 7, further comprising means for determining a worst corner of at least one statistically dependent parameter for the timing path.

12. The system of claim 11, wherein the timing design analyzing means analyzes the timing design based on a slack under the worst corner of the at least one statistically dependent parameter.

13. A computer program product storing in a readable memory device for analyzing a timing design of an integrated circuit, comprising:
computer usable program code which, when executed by a computer system, storing in a readable memory enable the computer system to:
receive an initial static timing analysis of the integrated circuit;
select a static timing test with respect to a static timing test point based on the initial static timing analysis;
select a timing path leading to the static timing test point for the static timing test;
determine an integrated slack path variability for the timing path based on a joint probability distribution of at least one statistically independent parameter
analyze the timing design based on the integrated slack path variability; and
enable the computer system to determine a sensitivity of the timing path to each of the at least one statistically independent parameter, the sensitivity being determined based on a probability distribution of the statistically independent parameter wherein the program code is configured to enable the computer system to determine the sensitivity to the statistically independent parameter approximately using formula:

$$S=(P_b-P_w)/(\sigma_b-\sigma_w),$$

where S indicates the sensitivity, $P_b$ indicates a slack under a best corner of the statistically independent parameter, and $P_w$ indicates a slack under a worst corner of the statistically independent parameter, and $\sigma_b$ and $\sigma_w$ indicate numbers of sigma points of distribution limits at the best and worst corners of the statistically independent parameter, respectively.

14. The program product of claim 13, wherein the program code is configured to enable the computer system to determine the integrated slack path variability of the timing path approximately using formula:

$$RSS = n\sqrt{\sum_{x=1}^{m} (S_x\sigma_x)^2},$$

where RSS denotes the integrated slack path variability, $S_x$ denotes sensitivity of the timing path to a statistically independent parameter x, $\sigma_x$ denotes a standard deviation of the statistically independent parameter x, n is a positive value less than approximately 6, and in denotes a total number of the at least one statistically independent parameter with respect to the timing path.

15. The program product of claim 13, wherein the program code is further configured to enable the computer system to select a static timing test under which a slack of the static timing test point is below a threshold.

16. The program product of claim 13, wherein, in response to multiple timing paths leading to the timing test point, the program code is configured to enable the computer system to rank the multiple timing paths based on slacks thereof and select a timing path that has the worst slack among the multiple timing paths to analyze first.

17. The program product of claim 13, wherein the program code is further configured to enable the computer system to determine a worst corner of at least one statistically dependent parameter for the timing path.

18. The program product of claim 13, wherein the program code is further configured to enable the computer system to analyze the timing design based on a slack under the worst corner of the at least one statistically dependent parameter.

19. A method of generating a system for analyzing a timing design of an integrated circuit and operable by a computing processor, the method comprising:
providing a computer infrastructure operable to:
receive an initial static timing analysis of the integrated circuit;
select a static timing test with respect to a static timing test point based on the initial static timing analysis;
select a timing path leading to the static timing test point for the static timing test;
determine an integrated slack path variability by a computer processor for the timing path based on a joint probability distribution of at least one statistically independent parameter
analyze the timing design based on the integrated slack path variability; and
operable to determine a sensitivity of the timing path to each of the at least one statistically independent parameter, the sensitivity being determined based on a probability distribution of the statistically independent parameter wherein the computer infrastructure is further operable to determine the sensitivity to the statistically independent parameter approximately using formula:

$S=(P_b-P_w)/(\sigma_b-\sigma_w)$, where S indicates the sensitivity, $P_b$ indicates a slack under a best corner of the statistically independent parameter, and $P_w$ indicates a slack under a worst corner of the statistically independent parameter, and $\sigma_b$ and $\sigma_w$ indicate numbers of sigma points of distribution limits at the best and worst corners of the statistically independent parameter, respectively.

20. The method of claim 19, wherein the computer infrastructure is farther operable to determine the integrated slack path variability of the timing path approximately using formula:

$$RSS = n\sqrt{\sum_{x=1}^{m} (S_x\sigma_x)^2},$$

where RSS denotes the integrated slack path variability, $S_x$ denotes sensitivity of the timing path to a statistically independent parameter x, $\sigma_x$ denotes a standard deviation of the statistically independent parameter x, n is a positive value less than approximately 6, and m denotes a total number of the at least one statistically independent parameter with respect to the timing path.

21. The method of claim 19, wherein, in response to multiple timing paths leading to the timing test point, the computer infrastructure is further operable to rank the multiple timing paths based on slacks thereof and select a timing path that has the worst slack among the multiple timing paths to analyze first.

22. The method of claim 19, wherein the computer infrastructure is further operable to determine a worst corner of at least one statistically dependent parameter for the timing path and to analyze the timing design based on a slack under the worst corner of the at least one statistically dependent parameter.

* * * * *